US006984133B2

(12) United States Patent
Naitou et al.

(10) Patent No.: US 6,984,133 B2
(45) Date of Patent: Jan. 10, 2006

(54) ELECTRICAL CONNECTOR HOUSING HAVING A BRIDGING PIECE BETWEEN CIRCUIT BOARDS CONNECTED TO A RECEIVING UNIT

(75) Inventors: Tsutomu Naitou, Yokkaichi (JP); Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/865,852

(22) Filed: Jun. 14, 2004

(65) Prior Publication Data
US 2004/0253850 A1  Dec. 16, 2004

(30) Foreign Application Priority Data
Jun. 13, 2003  (JP) .............................. 2003-170036

(51) Int. Cl.
*H01R 12/00* (2006.01)
*H05K 1/00* (2006.01)
(52) U.S. Cl. ...................................... 439/76.2; 439/949
(58) Field of Classification Search ............... 439/76.2, 439/949, 79
See application file for complete search history.

(56) References Cited

U.S. PATENT DOCUMENTS

| 3,268,850 A | | 8/1966 | Bernutz ...................... 439/745 |
| 4,720,267 A | | 1/1988 | De Jong ..................... 439/76.1 |
| 4,723,196 A | | 2/1988 | Hofmeister et al. ......... 361/759 |
| 5,060,113 A | * | 10/1991 | Jacobs ......................... 361/721 |
| 5,070,258 A | | 12/1991 | Izumi et al. ................. 327/565 |
| 5,408,383 A | * | 4/1995 | Nagasaka et al. ........... 361/707 |
| 5,618,186 A | * | 4/1997 | Saka et al. .................. 439/76.2 |
| 5,699,235 A | | 12/1997 | Tsurumiya et al. ......... 361/803 |
| 5,709,557 A | * | 1/1998 | Martin et al. ................. 439/79 |
| 6,597,578 B2 | * | 7/2003 | Shiina et al. ............... 361/728 |
| 6,835,073 B2 | * | 12/2004 | Kobayashi ................. 439/76.2 |
| 2001/0012212 A1 | | 8/2001 | Ikeda ......................... 363/141 |
| 2002/0157852 A1 | | 10/2002 | Chiriku et al. ................ 174/60 |

FOREIGN PATENT DOCUMENTS

| EP | 0 263 631 | 4/1988 |
| EP | 0 929 123 | 7/1999 |
| JP | A 07-079515 | 3/1995 |
| JP | A 10-149864 | 6/1998 |
| JP | A 2000-092659 | 3/2000 |
| JP | A 2002-305063 | 10/2002 |

* cited by examiner

*Primary Examiner*—Hae Moon Hyeon
(74) *Attorney, Agent, or Firm*—Oliff & Berridge, PLC (57) ABSTRACT

The invention relates to an electrical connector housing having a first casing, a second casing and a sidewall, and including a first printed circuit board and a second printed circuit board superposed with a given space. The first printed circuit board includes at least a first conductor and the second printed circuit board includes at least a second conductor. The electrical connector housing further includes a connector-receiving portion projecting from the sidewall and placed at a position between the first and second printed circuit boards. The first conductor on the first printed circuit board is connected to a first terminal device, while the second conductor on the second printed circuit board is connected to a second terminal device, and the first and second terminal devices protrude at the connector-receiving portion, so that they are adapted to connect to a terminal of an outside connector to be inserted into the connector-receiving portion.

16 Claims, 7 Drawing Sheets

FIG.10B

ELECTRICAL CONNECTOR HOUSING HAVING A BRIDGING PIECE BETWEEN CIRCUIT BOARDS CONNECTED TO A RECEIVING UNIT

CLAIM FOR PRIORITY

The present disclosure relates to subject-matter contained in and claims priority to Japanese Application No. 2003-170036, filed on Jun. 13, 2003.

BACKGROUND OF THE INVENTION

1. Field of Invention

The present invention relates to an electrical connector housing for installation aboard vehicles, and in particular to a housing whose internal circuit conductors are composed of a plurality of printed circuit boards. In the present invention, the electrical connector housing is designed such that connections with outside circuits can be made very easily.

2. Description of Related Art

Figure 1:
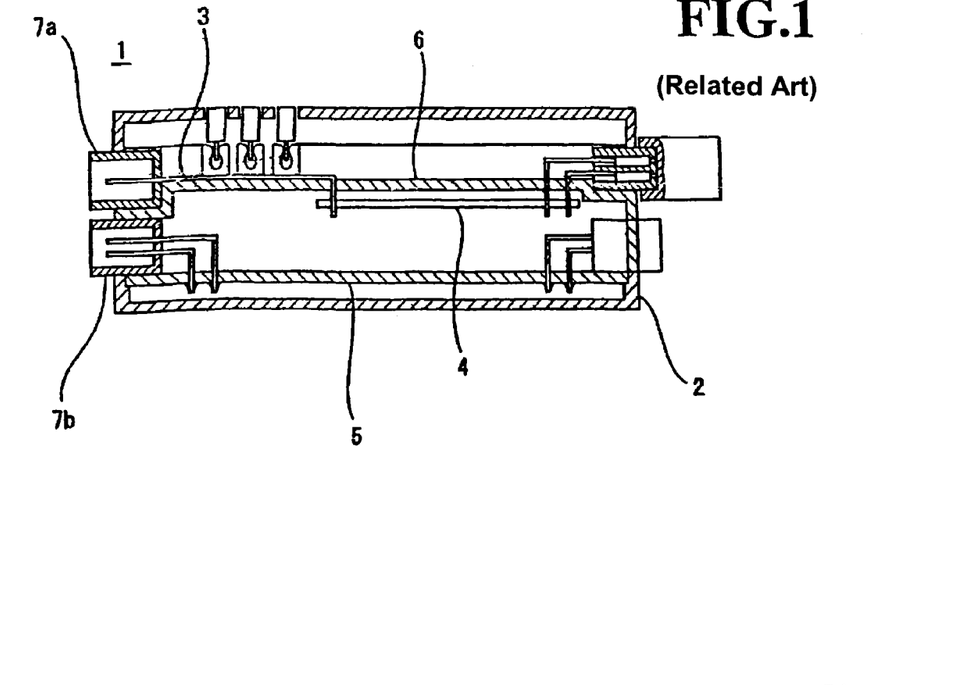
FIG. 1, already described, is a side view of an electrical connector housing of related art.

As shown in FIG. 1, a common electrical connector housing has a casing 2, in which a plurality of circuit elements (such as busbars 3 for internal circuits, electrical cables 4, printed circuit boards 5, etc.) are superposed on an insulating plate 6. An example of such a connector is described in more detail in document JP-A-2000-92659. The external face of the casing 2 is provided with one or several connector-receiving units, fuse-receiving units and relay-receiving units. These receiving units are equipped with terminals that are bound to the corresponding circuit elements and project into the receiving units, so that these terminals can be connected to outside connectors.

In this state of the art, the respective printed circuit boards 5 include connector-receiving units 7a and 7b, so as to provide connector outputs for each board.

However, the above configuration requires an increased number of parts, as the number of connectors and of connecting sites between the conductors of printed circuit boards increases. Moreover, such a configuration creates many constraints and unnecessarily increases conductor patterns. As a result, the number of layers of the printed circuit boards must be increased, which in turn raises material costs and increases the size and weight of the electrical connector housing manufactured.

Also, dies for forming busbars are very expensive. At the same time, there is a strong demand for miniaturizing, lightening and condensing the electrical connector housing. Such reasons have led users to choose printed circuit boards instead of busbars. This tendency has created new problems, namely how to simplify the connections between a printed circuit board and an outside connector, as well as between respective printed circuit boards.

SUMMARY OF THE INVENTION

Accordingly, an object of various aspects of the present invention is to provide an electrical connector housing containing a plurality of printed circuit boards, in which connection structures between a printed circuit board and an outside connector, as well as between respective printed circuit boards, are improved, so that the number of parts can be reduced, the connecting operation can be simplified and the patterns of printed circuit boards can be arranged more freely. As a result, excessive increase in the number of printed circuit boards can be avoided, and the size and weight of the electrical connector housing can be reduced.

To this end, there is provided an electrical connector housing having a first casing, a second casing and a sidewall, and containing a first printed circuit board and a second printed circuit board superposed with a given space. The first printed circuit board includes at least a first conductor, whereas the second printed circuit board includes at least a second conductor. Further, the electrical connector housing includes at least one connector-receiving portion projecting from the sidewall and placed at a position between the first and second printed circuit boards.

The first conductor on the first printed circuit board is connected to a first terminal device, and the second conductor on the second printed circuit board is connected to a second terminal device. The first and second terminal devices protrude at the connector-receiving portion, such as to be connectable to terminal device of an outside connector which can be inserted into the connector-receiving portion.

The first and second terminal devices may be substantially L-shaped terminals.

The first printed circuit board may include a first conductor and they are provided with a through-hole and a first terminal hole, while the second printed circuit board may include a second conductor and they are provided with a second terminal hole, and wherein there is provided a bridging piece comprising a first branch portion with a first contact section, a shoulder portion and a second branch portion with a second contact section, the first branch portion being longer than the second branch portion. The bridging piece can be inserted from the first printed circuit board toward the second printed circuit board, the first branch portion is passed through the through-hole and inserted into the second terminal hole in the second printed circuit board, and the first contact section is fixed to the terminal hole, and the second branch portion is inserted into the first terminal hole in the first printed circuit board and the second contact section is fixed to the terminal hole, whereby the conductors of the first and second printed circuit boards are electrically connected.

The through-hole in the first printed circuit board may be provided in that part of the first printed circuit board where no conductor is wired.

Suitably, the first and second contact sections may be fixed to the corresponding terminal holes by soldering.

Alternatively, the first and second contact sections may be fixed to the corresponding terminal hole by press-fitting.

The first and second terminal holes may be provided with respective terminal conductors.

Alternatively, the first printed circuit board may include a first conductor and they are provided with a first terminal hole, while the second printed circuit board may include a second conductor and they are provided with a second terminal hole, wherein a substantially straight bridging piece includes first and second end portions, the substantially straight bridging piece being passed through the first and second conductors, respectively. The first and second end portions may be inserted into the first and second terminal holes, respectively, and fixed thereto by soldering, whereby the conductors of the first and second printed circuit boards are electrically connected.

The substantially straight bridging piece may be a substantially straight terminal.

Alternatively, the substantially straight bridging piece may be a jump cable containing one or several core wires and having first and second end portions, wherein the core wires are exposed in the first and second end portions.

Suitably, the electrical connector housing may include a further connector-receiving portion on at least one housing portion selected from the group consisting of the first casing, the second casing and the sidewall, and one of the first conductor and the second conductor which are connected to each other by the bridging piece may be connected to a substantially L-shaped terminal which protrudes at the at least one housing portion.

Suitably still, the electrical connector housing may include a further connector-receiving portion on at least one housing portion selected from the group consisting of the first casing, the second casing and the sidewall. One of the first conductor the and the second conductor which are connected to each other by the substantially straight bridging piece may be connected to a third terminal device which protrudes at the at least one housing portion.

Suitably yet, the third terminal device may be a substantially L-shaped terminal.

The connector-receiving portion may be provided with a joint connector having at least one joint terminal, so that the at least one joint terminal can be connected to the first, second and/or third terminal device.

The joint connector may include the at least one joint terminal and a second terminal adapted to be connected to an outside electrical cable.

Various aspects of the present invention also relate to a system for cabling a vehicle comprising an electrical connector housing having a first casing, a second casing and a sidewall, and containing a first printed circuit board and a second printed circuit board superposed with a given space, the first printed circuit board comprising at least a first conductor and the second printed circuit board comprising at least a second conductor.

Further, the electrical connector housing may include a connector-receiving portion projecting from the sidewall and placed at a position between the first and second printed circuit boards, the first conductor on the first printed circuit board is connected to a first terminal device, and the second conductor on the second printed circuit board is connected to a second terminal device, and the first and second terminal devices protrude at the connector-receiving portion, such as to be connectable to terminal device of an outside connector which can be inserted into the connector-receiving portion.

Various aspects of the invention further relate to a method of cabling a vehicle, wherein it uses an electrical connector housing having a first casing, a second casing and a sidewall, and containing a first printed circuit board and a second printed circuit board superposed with a given space, the first printed circuit board comprising at least a first conductor and the second printed circuit board comprising at least a second conductor.

Further, the electrical connector housing may include a connector-receiving portion projecting from the sidewall and placed at a position between the first and second printed circuit boards, the first conductor on the first printed circuit board is connected to a first terminal device, and the second conductor on the second printed circuit board is connected to a second terminal device, and the first and second terminal devices protrude at the connector-receiving portion, such as to be connectable to terminal device of an outside connector which can be inserted into the connector-receiving portion.

According to various aspects of the invention, a plurality of connector-receiving portions e.g., units, to be connected to the conductors in the first (e.g., upper) and second (e.g., lower) printed circuit boards, are arranged in parallel along a casing sidewall.

Accordingly, the terminal connected to a conductor on the first printed circuit board and that connected to a conductor on the second printed circuit board can be protruded in a single connector-receiving unit. Thus, a connector fitted into that connector-receiving unit can be connected to the conductors of both first and second printed circuit boards. If necessary, a plurality of electrical cables can be grouped into a single connector and connected together to the conductors of the first and second printed circuit boards.

Further, when a joint terminal is provided in the connector, the conductors of the first and second printed circuit boards can be connected to each other through that connector. Such a configuration confers more operational freedom on the conductor patterns of the printed circuit boards and reduces unnecessary space. Further, it can reduce the number of layers of the printed circuit boards, and reduce the size and manufacturing costs of the electrical connector housing.

Further, the terminal piece that connects the conductor of the first printed circuit board to that of the second printed circuit board can be formed into a U-shape, so that it can be soldered from the same side, and operation is simplified.

In the above structure, a press-fit unit may be placed into contact, through its press-fit terminal, with a terminal hole which may include a conductor in its internal face. Thus, when the first and second printed circuit boards are connected by this press-fit terminal, the soldering operation between the conductor and the terminal can be obviated. The press-fit terminal enables to connect two separate sites by a single insertion operation, and increases work efficiency greatly.

Further, when several printed circuit boards are superposed, more connecting points are required for conductors on the printed circuit boards. This creates constraints for setting conductor patterns and increases non-usable areas. However, when the conductors on the first and second printed circuit boards are connected directly by the above terminal piece, there is more freedom for setting conductor patterns, and a high-density wiring becomes possible.

Further, in the above structure, the joint terminal can be used as a joint busbar that is not connected to electrical cables. More particularly, it can be used to connect a conductor on the first printed circuit board to a conductor on the second printed circuit board inside the connector-receiving unit.

Alternatively, the joint terminal can include an end portion connected to an electrical cable, and another end portion formed into a plurality of terminal sections which can connect the conductors on the first printed circuit board and the second printed circuit board. Such a connection system can be used e.g., for an earth circuit.

BRIEF DESCRIPTION OF THE DRAWINGS

The above, and the other objects, features and advantages of aspects of the present invention will be made apparent from the following description of the preferred embodiments, given as non-limiting examples, with reference to the accompanying drawings, in which.

DETAILED DESCRIPTION OF EXEMPLARY EMBODIMENTS

FIGS. 2 to 5 show an electrical connector housing 10 according to a first embodiment of the invention. This housing 10 is used to connect a wire harness for vehicles. It includes a first (e.g., upper) casing 11 and a second (e.g., lower) casing 12, and contains a first printed circuit board 21, a second printed circuit board 22 and busbars 27 and 28.

Figure 3:
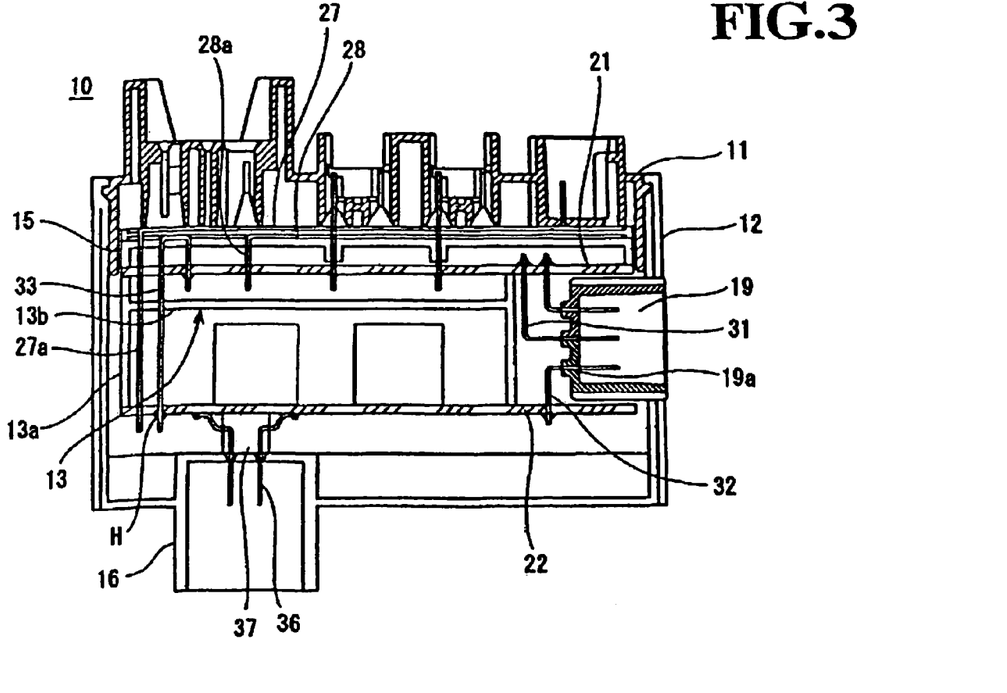
FIG. 3 is cross-sectional side view of the electrical connector housing of FIGS. 2A, 213 and 2C.

As shown in FIG. 3, the casings 11 and 12 contain a-board holder 13 that is formed of e.g., two flanges 13a, each with first and second ends (corresponding respectively to the upper and lower ends in FIG. 3), and e.g., a web plate 13b which bridges the two flanges 13a substantially halfway between the first and second ends. The first printed circuit board 21 is fixed on the first end of the flanges 13a, and the second printed circuit board 22 is fixed on the second end of the flanges 13a. A busbar-layer support casing 15 is provided above the first printed circuit board 21.

First and second busbars 27 and 28 are placed over the busbar-layer support casing 15 via an interposed insulating plate. A first end portion of the first busbar 27 is turned downward as shown in FIG. 3, and forms a first busbar tab 27a which is connected to a conductor of the second printed circuit board 22. Likewise, a first end portion of the second busbar 28 is turned downward as shown in FIG. 3, and forms a second busbar tab 28a which is connected to a conductor of the first printed circuit board 21.

Figure 2A:
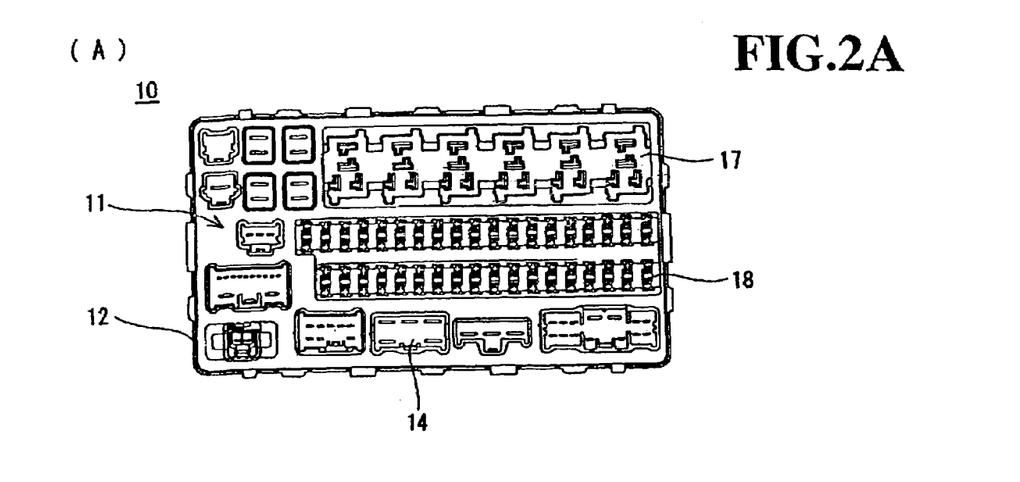
FIG. 2A is a top plan view of the electrical connector housing of a first embodiment of the present invention.
Figure 2B:
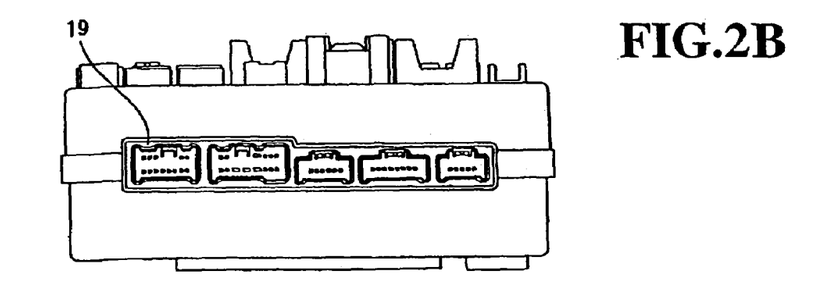
FIG. 2B is a side view of the electrical connector housing of a first embodiment of the present invention.
Figure 2C:
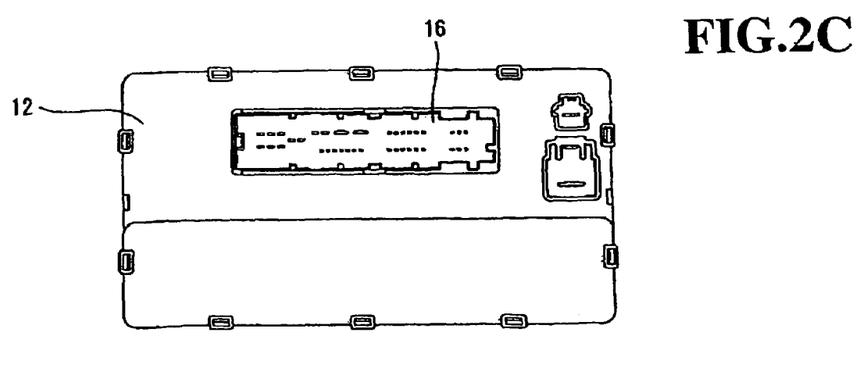
FIG. 2C is a top plan view of the electrical connector housing of a first embodiment of the present invention, as viewed from the side opposite to the one shown in FIG. 2A.

As shown in FIG. 2A, the external face of the first casing 11 is provided with one or several connector-receiving portions, e.g., units 14, relay-receiving portions, e.g., units 17 and fuse-receiving portions, e.g., units 18. A first sidewall of the second casing 12 (FIG. 2B) is provided with a connector-receiving unit 19 projecting outwardly from a position located between the first printed circuit board 21 and the second printed circuit board 22 inside the second casing 12. As shown in FIG. 2C, the external face of the second casing 12 is also provided with a connector-receiving unit 16.

Second end portions of the first and second busbars 27 and 28 are turned upwardly (FIG. 3), and form corresponding busbar tabs which protrude into the connector-receiving unit 14, relay-receiving unit 17 and fuse-receiving unit 18 provided on the first casing 11 (FIG. 2A).

An L-shaped terminal 31 is extended downwardly (in FIG. 3) into a terminal hole of its corresponding conductor on the first printed circuit board 21, and connected to that conductor by soldering. An L-shaped terminal 32, inverted with respect to terminal 31, is extended upwardly (in FIG. 3) into a terminal hole of a corresponding conductor on the second printed circuit board 22, and connected to the conductor by soldering.

The bent end portions of the L-shaped and inverted L-shaped terminals 31 and 32 are made to protrude into the connector-receiving unit 19 through a respective hole 19a. They can thus be connected to a connector (not shown in the figures) fitted into the connector-receiving unit 19, and from there to a wire harness that forms an outside circuit. As shown in FIG. 2B, a plurality of such connector-receiving units 19 are arranged in parallel along a sidewall of the casing 12.

Figure 4A:
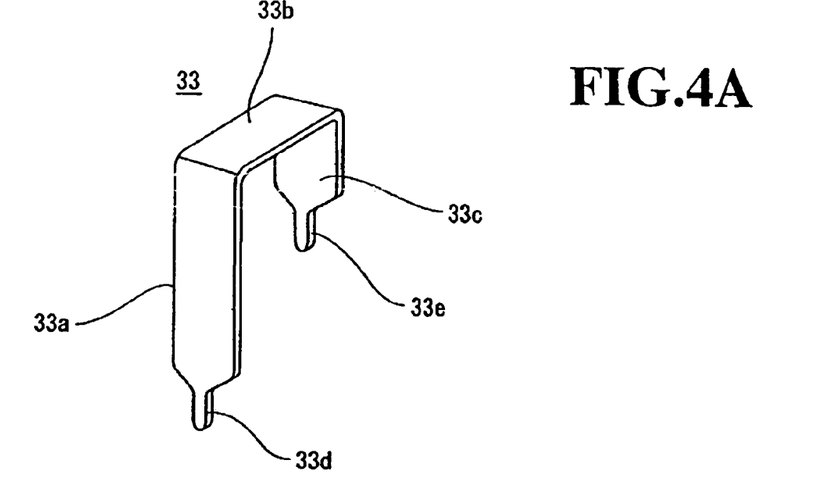
FIG. 4A is a perspective view of a terminal piece implemented in the embodiments of the invention, connecting a conductor on a first printed circuit board to a conductor on a second printed circuit board.

Among the conductors of the first printed circuit board 21 and those of the second printed circuit board 22, given conductors, designated 23 and 25 (see FIG. 4B), are connected by a terminal piece 33 which has substantially U-shaped form, but with on branch 33a made longer than the other 33c (FIG. 4A). More specifically, terminal piece 33 includes a first branch portion 33a, a shoulder portion 33b forming the base of the U (here vertically inverted) and a second branch portion 33c, the first branch portion 33a being made longer than the second branch portion 33c. The first and second branch portions 33a and 33c include corresponding first and second soldering sections 33d and 33e at their tip portions.

Figure 4B:
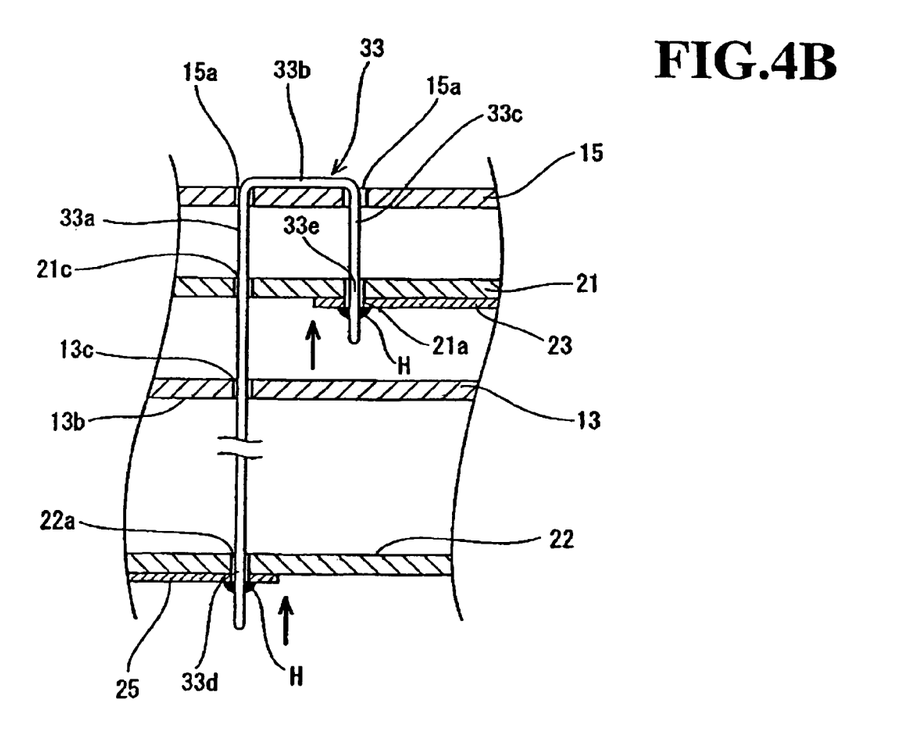
FIG. 4B shows how the terminal piece of FIG. 4A is used for connecting the first and second printed circuit boards.

As shown in FIG. 4B, the soldering sections 33d and 33e of the terminal piece 33 are inserted, respectively, through a terminal hole 21a formed in the conductor 23 of the first printed circuit board 21 and a terminal hole 22a formed in the conductor 25 of the second printed circuit board 22. The terminal pieces can thus be soldered from the same direction, as shown by arrows in FIG. 4B.

In order to lead the first branch portion 33a onwards, the web plate 13b and the first printed circuit board 21 are provided with large-size through-holes, respectively designated 13c and 21c, at positions aligned with the corresponding terminal hole 22a on the second printed circuit board 22.

Further, the terminal piece 33 is passed into through-holes 15a which are formed in the busbar-layer holding casing 15. Then, the first branch portion 33a is passed into the through-hole 21c of the first printed circuit board 21, while the second soldering section 33e of the second branch portion 33c is passed through the terminal hole 21a in the first printed circuit board 21, and welded with solder H from underneath (as shown in FIG. 4B).

Thereafter, the first printed circuit board 21 is fixed on the first ends of the flanges 13a of the board holder 13 (see FIG. 3), and the branch portion 33a is passed into the through-hole 13c in the web plate 13b. Then, the second printed circuit board 22 is fixed on the second ends of the flanges 13a of the board holder 13. As shown in FIG. 4B, the first soldering section 33d of the first branch portion 33a is then passed through the terminal hole 22a in the second printed circuit board 22 and welded with solder H from underneath.

Further, a substantially L-shaped terminal 36 (FIG. 9) is molded in resin 37, and a bent section of the terminal 36 (horizontally extending part in FIG. 9) is soldered to a conductor on a second face of the second printed circuit board 22, and a straight section of the terminal 36 (vertically extending part in FIG. 9) is protruded into a connector-receiving unit 16 formed on an external face of the second casing 12.

Accordingly, the L-shaped terminal 31 is connected to the conductors on the first printed circuit board 21 (placed above in FIGS. 8 & 9) from beneath, while the inverted L-shaped terminal 32 is connected to the conductors on the second printed circuit board 22 (placed below in FIGS. 8 & 9) from above, whereby both terminals 31 and 32 are placed closer together. Thus, both terminals 31 and 32 are protruded into one connector-receiving unit 19, so that the conductors of both printed circuit boards 21 and 22 can be connected to one connector which is wired to a plurality of outside electrical cables.

With the above-mentioned terminal piece 33, connections of the conductors between the first and second printed circuit boards 21 and 22 can be made snug when they are made at a position away from the connector-receiving unit 19. When the connections are to be made near the connector-receiving unit 19, the L-shaped terminal 31 and the inverted L-shaped terminal 32 may be connected by a joint connector 40 fitted into the connector-receiving unit 19 (see FIGS. 5A & 5B). When the printed circuit boards 21 and 22 are small, all the conductors of the first and second printed circuit boards 21 and 22 may be connected by such joint connectors 40, instead of terminal pieces 33.

Figure 5A:
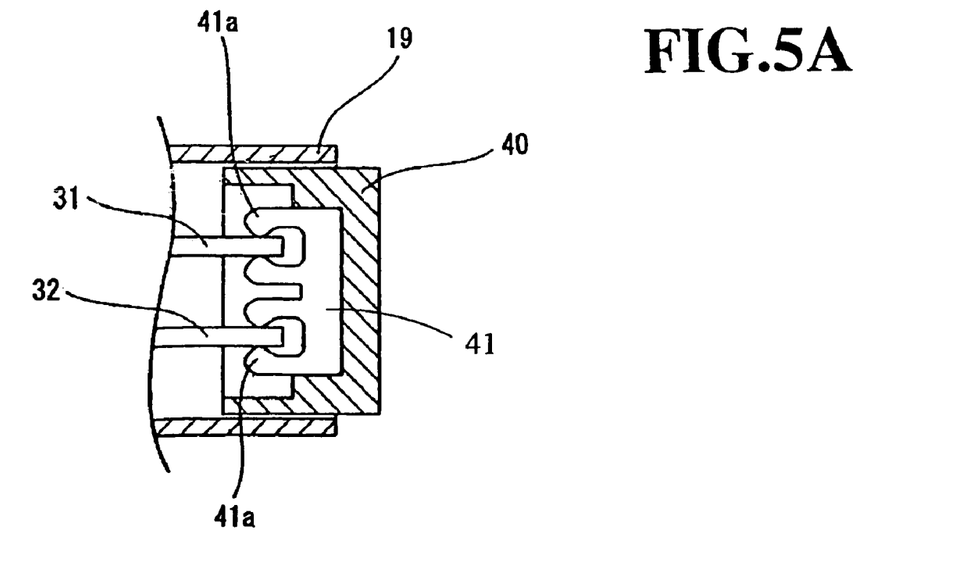
FIG. 5A is a cross-sectional view of a joint connector showing how the connections are established between the terminals in the connector-receiving unit of the first embodiment.

The joint connector 40 shown in FIG. 5A contains a joint terminal (e.g., joint busbar) 41 having e.g., two sets of bifurcated terminals 41a arranged in parallel. The above terminals 31 and 32 can thus be pushed into these bifurcated terminals 41a for making the electrical connections.

Figure 5B:
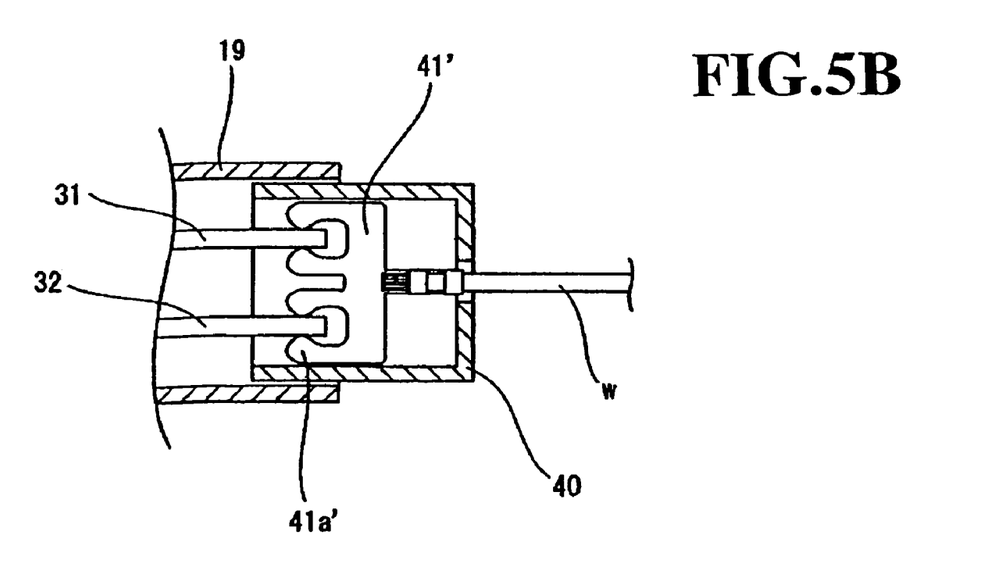
FIG. 5B shows an alternative implementation of the joint connector of FIG. 5A.

The use of joint connectors 40 for the connections of the conductors between the first and second printed circuit boards 21 and 22 makes it unnecessary to use terminal pieces 33. Accordingly, depending on whether the conductors of the first and second printed circuit boards 21 and 22 are placed near or away from the connector-receiving unit 19, they may be connected either by joint connectors 40 or by terminal pieces 33.

The joint connector 40 shown in FIG. 5B contains not only two sets of bifurcated terminals 41a', but also a joint terminal 41' in extension thereof. In this configuration, the conductors on the first and second printed circuit boards 21 and 22 can be connected to an electrical cable w, so that splice connections between electrical cables outside the housing become unnecessary. This electrical cable w may be used for an earth circuit, an electrical power circuit or signal circuits. Thus, use of the joint connector 40 for connecting the conductors of the first and second printed circuit boards 21 and 22 can reduce the number of connecting sites used by the terminal pieces 33. The constraints for wiring are thus reduced, while wiring becomes freer and a high-density wiring becomes possible.

As shown in FIG. 3, when connections between the conductors of the first and second printed circuit boards 21 and 22 are required at a position away from the connector-receiving unit 19, they may be made by using a terminal piece 33. In this manner, it is not necessary to extend the conductors of both boards 21 and 22 towards the connector-receiving unit 19; this confers more freedom for setting conductor patterns.

As shown in FIG. 3, the conductors on the first and second printed circuit boards 21 and 22 are connected, via busbars 27 and 28, to connectors, relays and/or fuses respectively fitted into the connector-receiving units 14, the relay-receiving units 17 and/or the fuse-receiving units 18 provided on the first casing 11.

Likewise, the above conductors are protruded into the connector-receiving unit 16 provided on the second casing 12 via the terminal 36 bound to the conductors of the second printed circuit board 22, and can thereby be connected thus to an outside connector fitted into the connector-receiving unit 16.

Accordingly, the conductors on the first and second printed circuit boards 21 and 22 can be connected to the terminals which protrude into the connector-receiving units 14, 19 and 16 respectively formed on an external face of the first casing 11, and on the sidewall and external face of the second casing 12. This configuration gives more freedom for configuring the conductor-pattern, reduces unnecessary space, and enables to form a high-density pattern.

Figure 6:
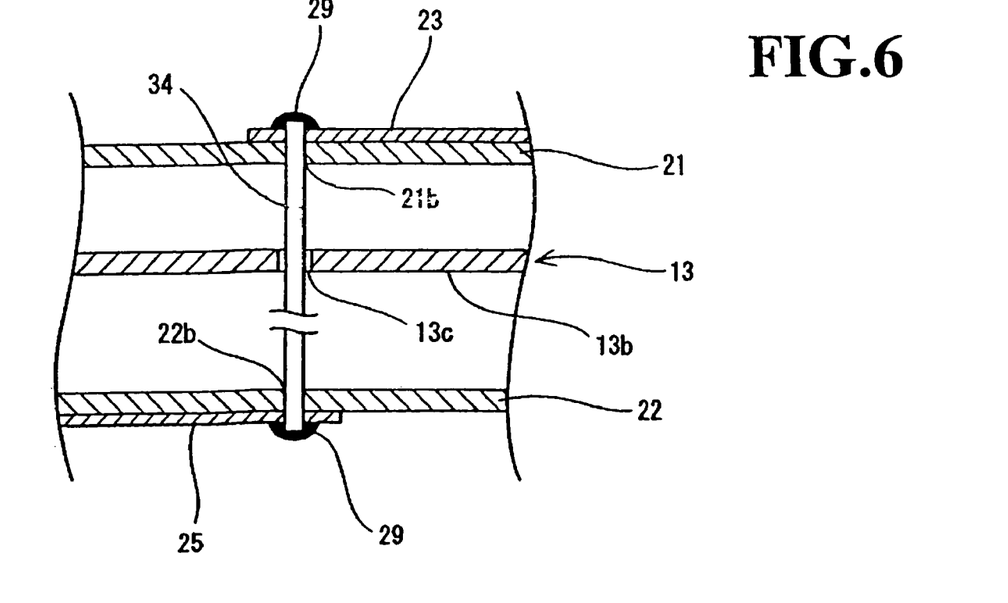
FIG. 6 is a cross-sectional view of a first variant of the first embodiment.
Figure 7:
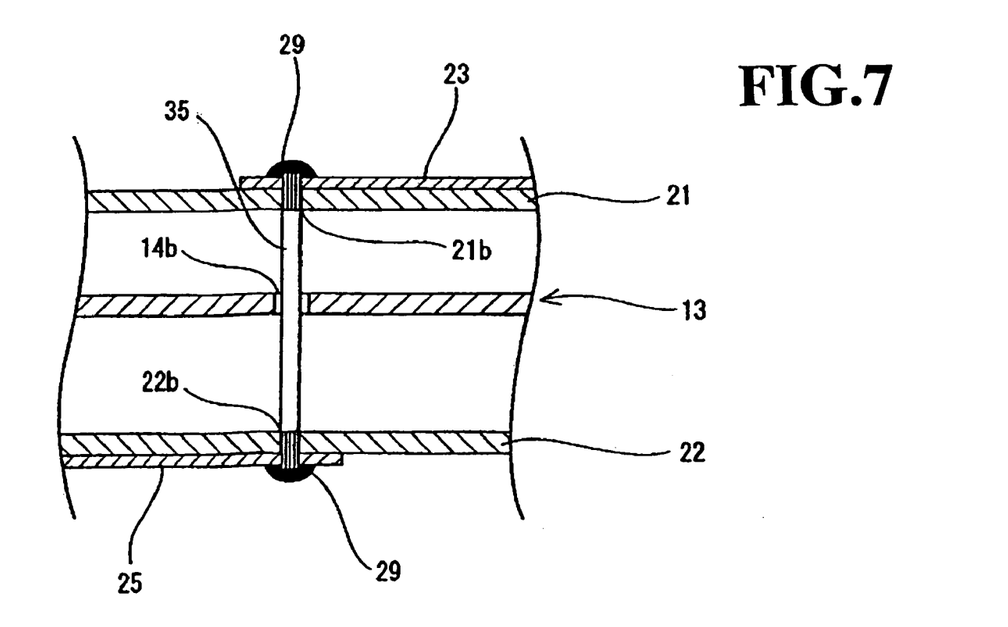
FIG. 7 is a cross-sectional view of a second variant of the first embodiment.

FIGS. 6 and 7 show respectively a first variant and a second variant of the first embodiment, relating to connections between the first and second printed circuit boards 21 and 22. The first variant utilizes a straight terminal 34 instead of a curved or bent terminal, whereas the second variant uses a jumper terminal 35 in which core wires are exposed at both ends.

In either case, the terminal 34 or 35 is inserted into the through-hole 21b in the first printed circuit board 21, the through-hole 22b in the second printed circuit board 22, and the terminal hole 13c in the web plate 13b. Each end of the terminal 34 or 35 is then soldered to the corresponding conductor 23 or 25, forming thus a soldered connecting portion 29.

Figure 8:
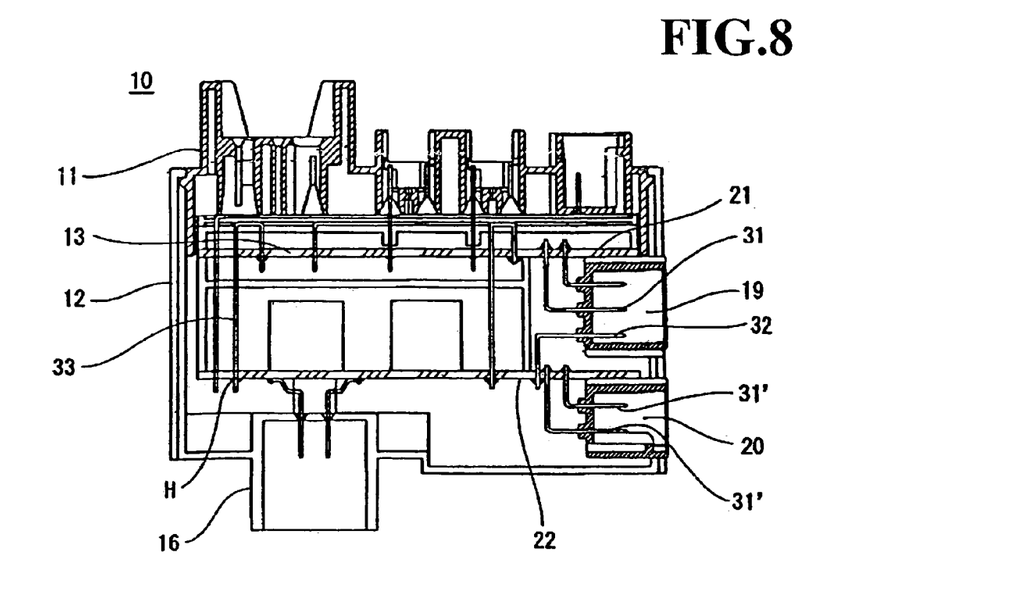
FIG. 8 is a cross-sectional side view of the electrical connector housing according to a second embodiment of the present invention.

FIG. 8 shows an electrical connector housing 10 according to a second embodiment of the present invention, in which the sidewall of the second casing 12 includes first and second connector-receiving units, respectively designated 19 and 20, arranged at two levels, as seen in the figure. The first connector-receiving units 19, arranged at the upper level, contains protruding terminals 31 and 32 respectively connected to the first printed circuit board 21 and the second printed circuit board 22, as in the case of the first embodiment. On the other hand, the second connector-receiving unit 20, arranged at the lower level, contains a protruding L-shaped terminal 31' connected to the second printed circuit board 22.

In the above structure, the terminal 31 of the first printed circuit board 21 is connected to the terminal 32 in the connector-receiving unit 19. This terminal 32 is in turn connected to the conductors of the second printed circuit board 22. When these conductors are connected to the terminal 31', the conductors of the first printed circuit board 21 can be fed out into the connector-receiving unit 20 at the lower stage. Thus, a connector fitted into the connector-receiving unit 20 can also be connected to the conductors of the first and second printed circuit boards 21 and 22.

Figure 9:
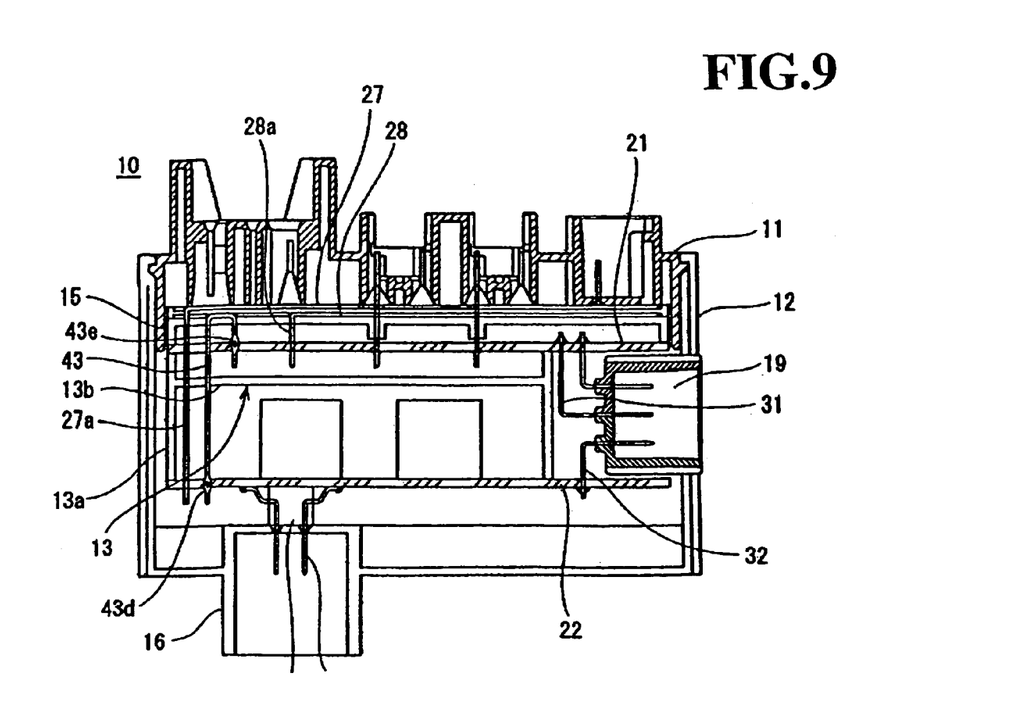
FIG. 9 is a cross-sectional side view of the electrical connector housing according to a third embodiment.
Figure 10A:
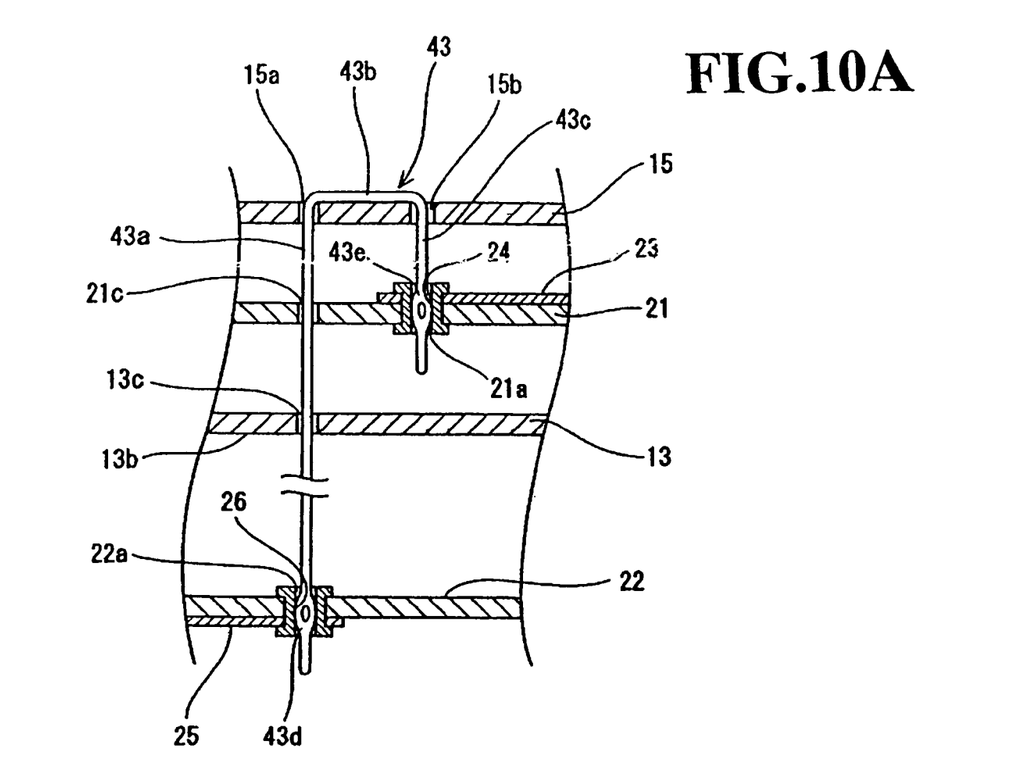
FIG. 10A is a side view of a press-fit terminal connecting the conductors on the first and second printed circuit boards.
Figure 10B:
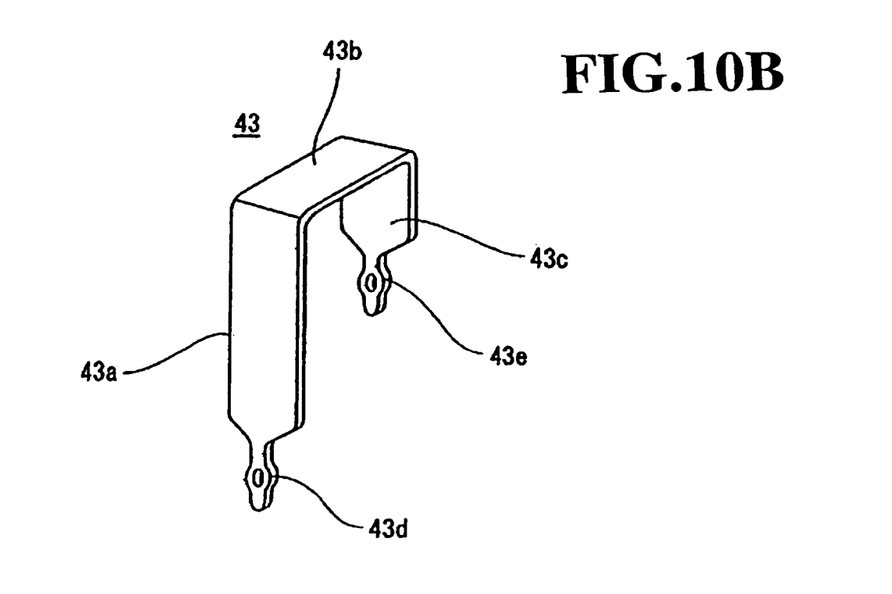
FIG. 10B is a perspective view of the press-fit terminal of FIG. 10A.

FIGS. 9 and 10 show an electrical connector housing 10 according to a third embodiment of the present invention, in which the terminal piece 33, connected to the conductors of the first and second printed circuit boards 21 and 22 by soldering in the first embodiment, is replaced by a press-fit terminal 43.

The press-fit terminal 43 may have a U-shape. Similar to the terminal piece 33, the press-fit terminal 43 may have a first branch portion 43a, a shoulder portion 43b forming the base of the U, and a second branch portion 43c, the first branch portion 43a being longer than the second branch portion 43c. The first branch portion 43a and the second branch portion 43c comprise, respectively at their edge, a first press-fit section 43d and a second press-fit section 43e. In other words, the soldering sections 33d and 33e of the terminal piece 33 are replaced by the press-fit sections 43d and 43e.

On the other hand, the terminal holes 21a and 22a respectively formed in the first and second printed circuit boards 21 and 22 are provided with corresponding plated conductors 24 and 26 connected to the conductors 23 and 25, respectively. The press-fit sections 43e and 43d pushed into the respective terminal holes 21a and 22a are thus electrically connected via these plated conductors 24 and 26.

The press-fit terminal 43 is passed into the through-hole 15a formed in the busbar-layer holder 15. Then, the first branch portion 43a passes the through-hole 21c of the first printed circuit board 21, while the second press-fit section 43e of the second branch portion 43c is press-fitted into the terminal hole 21a of the first printed circuit board 21, and placed into contact with the plated conductor 24.

While the first printed circuit board 21 is fixed on the first ends of the flanges 13a of the board holder 13, the first branch portion 43a passes the through-hole 13c formed in the web plate 13b, and the first press-fit section 43d of the first branch portion 43a is press-fitted into the terminal hole 22a formed in the second printed circuit board 22 (which is fixed on the second ends of the flanges 13a), and placed into contact with the plated conductor 26. In this manner, the conductors 23 and 25 of the respective first and second printed circuit boards 21 and 22 can be connected to each other.

The use of a press-fit terminal not only obviates the soldering between the conductor of a printed circuit board and a terminal piece, but also simplifies and improves the fitting operations greatly, in that one fitting operation enables the connections at two different sites simultaneously.

The constructions of the electrical connector housing according to the third embodiment, other than those described above, are the same as those of the first embodiment, and thus shown using the same references.

According to the present invention, there is provided a connector-receiving unit on the sidewall of an electrical connector housing, at a position between the first printed circuit board and the second printed circuit board contained the electrical connector housing. This connector-receiving unit is designed such that, when an outside connector is fitted thereto, it can not only connect with the first and second printed circuit boards, but also make connections between them or perform a branching thereof.

This configuration enables to reduce the number of connecting sites between the printed circuit boards when wiring internal circuits. Accordingly, the circuits can be wired with less constraint and with a higher density, and the electrical connector housing can be miniaturized. Further, as the number of parts such as connectors and terminals can be reduced, and unnecessary wiring patterns can be avoided, production costs can also be lowered.

When the conductors located at the position away from the connector-receiving unit on the two printed circuit boards are to be connected, the conductors of these printed circuit boards may be provided with terminal holes. Then, a substantially U-shaped terminal piece may be inserted into the terminal hole and soldered from the same direction. Thus, the connections between the two printed circuit boards can be effected very easily. If a press-fit terminal having press-fit end sections is used instead of this terminal piece, soldering operation can be obviated.

Although the invention has been described with reference to particular means, materials and embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

The present disclosure relates to subject matter contained in priority Japanese Application No. 2003-170036, filed on Jun. 13, 2003, which is herein expressly incorporated by reference in its entirety.

What is claimed is:

1. An electrical connector housing, comprising:
   a first casing bounding an upper side of the electrical connector housing;
   a second casing bounding a lower side of the electrical connector housing;
   a sidewall connecting between the first and second casings;
   a first printed circuit board and a second printed circuit board superposed with a given space;
   at least one connector-receiving portion projecting from the sidewall and placed at a position between the first and second printed circuit boards; and
   a bridging piece, wherein
   the first printed circuit board includes at least a first conductor,
   the second printed circuit board includes at least a second conductor,
   the first conductor on the first printed circuit board is connected to a first terminal device, and the second conductor on the second printed circuit board is connected to a second terminal device,
   the first and second terminal devices protrude at the connector-receiving portion, to be connectable to a terminal device of an outside connector, which is insertable into the connector-receiving portion;
   the first conductor is provided with a through-hole and a first terminal hole,
   the second conductor is provided with a second terminal hole,
   the bridging piece comprises:
      a first branch portion with a first contact section,
      a shoulder portion, and
      a second branch portion with a second contact section, the first branch portion being longer than the second branch portion,
   the bridging piece is insertable from the first printed circuit board toward the second printed circuit board,
   the first branch portion passes through the through-hole and is inserted into the second terminal hole in the second printed circuit board,
   the first contact section is fixed to the second terminal hole, and
   the second branch portion is inserted into the first terminal hole in the first printed circuit board and the second contact section is fixed to the first terminal hole, whereby the conductors of the first and second printed circuit boards are electrically connected.

2. The electrical connector housing according to claim 1, wherein the first and second terminal devices are substantially L-shaped terminals.

3. The electrical connector housing according to claim 1, wherein the through-hole in the first printed circuit board is provided in that part of the first printed circuit board where no conductor is wired.

4. The electrical connector housing according to claim 1, wherein the first and second contact sections are fixed to the corresponding terminal holes by soldering.

5. The electrical connector housing according to claim 1, wherein the first and second contact sections are fixed to the corresponding terminal holes by press-fitting.

6. The electrical connector housing according to claim 1, wherein the first and second terminal holes are provided with respective terminal conductors.

7. The electrical connector housing according to claim 1, further comprising:
a further connector-receiving portion on at least one housing portion selected from the group consisting of the first casing, the second casing, the sidewall, and one of the first and the second conductors, which are connected to each other by the bridging piece, wherein the further connector-receiving portion is connected to a substantially L-shaped terminal, which protrudes at the further connector-receiving portion.

8. The electrical connector housing according to claim 1, wherein
the first printed circuit board comprises a first conductor provided with a first terminal hole,
the second printed circuit board comprises a second conductor provided with a second terminal hole,
the bridging piece is substantially straight with first and second end portions,
the substantially straight bridging piece passes through the first and second conductors respectively so that the first and second end portions are inserted into the first and second terminal holes respectively and fixed thereto by soldering, whereby
the conductors of the first and second printed circuit boards are electrically connected.

9. The electrical connector housing according to claim 8, wherein the substantially straight bridging piece is a substantially straight terminal.

10. The electrical connector housing according to claim 8, wherein
the substantially straight bridging piece is a jump cable containing one or several core wires having first and second end portions,
each of the one or several core wires are exposed in the first and second end portions.

11. The electrical connector housing according to claim 8, further comprising:
a further connector-receiving portion on at least one housing portion selected from the group consisting of the first casing, the second casing, the sidewall, and one of the first and second conductors, which are connected to each other by the substantially straight bridging piece, wherein the further connector-receiving portion is connected to a third terminal device, which protrudes at the further connector-receiving portion.

12. The electrical connector housing according to claim 11, wherein the third terminal device is a substantially L-shaped terminal.

13. The electrical connector housing according to claim 11, further comprising a joint connector insertable into, the connector-receiving portion, the joint connector having at least one joint terminal, so that the at least one joint terminal can be connected to the first, second and/or third terminal device.

14. The electrical connector housing according to claim 13, wherein the joint connector comprises the at least one joint terminal and another terminal adapted to be connected to an outside electrical cable.

15. A system for cabling a vehicle, comprising
an electrical connector housing including
a first casing bounding an upper side of the electrical connector housing;
a second casing bounding a lower side of the electrical connector housing;
a sidewall connecting between the first and second casings;
a first printed circuit board;
a second printed circuit board superposed with a given space;
a connector-receiving portion projecting from the sidewall and placed at a position between the first and second printed circuit boards; and
a bridging piece, wherein
the first printed circuit board comprises at least a first conductor,
the second printed circuit board comprises at least a second conductor,
the first conductor on the first printed circuit board is connected to a first terminal device,
the second conductor on the second printed circuit board is connected to a second terminal device,
the first and second terminal devices protrude at the connector-receiving portion, to be connectable to terminal devices of an outside connector, which is insertable into the connector-receiving portion;
the first conductor is provided with a through-hole and a first terminal hole,
the second conductor is provided with a second terminal hole, and
the bridging piece comprises:
a first branch portion with a first contact section,
a shoulder portion, and
a second branch portion with a second contact section, the first branch portion being longer than the second branch portion,
the bridging piece is insertable from the first printed circuit board toward the second printed circuit board,
the first branch portion passes through the through-hole and is inserted into the second terminal hole in the second printed circuit board,
the first contact section is fixed to the second terminal hole, and
the second branch portion is inserted into the first terminal hole in the first printed circuit board and the second contact section is fixed to the first terminal hole, whereby the conductors of the first and second printed circuit boards are electrically connected.

16. A method of cabling a vehicle, comprising:
providing in the vehicle an electrical connector housing having a first casing, a second casing and a sidewall,
providing in the vehicle a first printed circuit board and a second printed circuit board superposed with a given space,
providing the first printed circuit board with at least a first conductor and the second printed circuit board with at least a second conductor,
providing the electrical connector housing with a connector-receiving portion projecting from the sidewall,
disposing the electrical connector housing at a position between the first and second printed circuit boards,
connecting the first conductor on the first printed circuit board to a first terminal device,
connecting the second conductor on the second printed circuit board to a second terminal device, protruding the first and second terminal devices at the connector-receiving portion, inserting terminal devices of an outside connector into the connector-receiving portion, providing the first conductor with a through-hole and a first terminal hole, providing the second printed circuit board with a second conductor that includes a second terminal hole, and providing a bridging piece that includes a first branch portion with a first contact section, a shoulder portion and a second branch portion with a second contact section, the first branch portion being longer than the second branch portion, inserting the bridging piece from the first printed circuit board toward the second printed circuit board, passing the first branch portion through the through-hole, inserting the first branch portion into the second terminal hole in the second printed circuit board, fixing the first contact section to the second terminal hole, inserting the second branch portion into the first terminal hole in the first printed circuit board, fixing the second contact section to the first terminal hole, and electrically connecting the conductors of the first and second printed circuit boards.

* * * * *